(12) United States Patent
Arai

(10) Patent No.: US 11,538,777 B2
(45) Date of Patent: Dec. 27, 2022

(54) SEMICONDUCTOR STRUCTURE CONTAINING PRE-POLYMERIZED PROTECTIVE LAYER AND METHOD OF MAKING THEREOF

(71) Applicant: SANDISK TECHNOLOGIES LLC, Addison, TX (US)

(72) Inventor: Hajime Arai, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 128 days.

(21) Appl. No.: 16/918,189

(22) Filed: Jul. 1, 2020

(65) Prior Publication Data
US 2022/0005772 A1 Jan. 6, 2022

(51) Int. Cl.
*H01L 23/00* (2006.01)

(52) U.S. Cl.
CPC ............ *H01L 24/05* (2013.01); *H01L 23/562* (2013.01); *H01L 24/03* (2013.01); *H01L 2224/02206* (2013.01); *H01L 2224/02215* (2013.01); *H01L 2224/03019* (2013.01); *H01L 2224/03614* (2013.01); *H01L 2224/0401* (2013.01); *H01L 2224/05083* (2013.01); *H01L 2224/05124* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05171* (2013.01); *H01L 2224/05184* (2013.01); *H01L 2924/0715* (2013.01);
(Continued)

(58) Field of Classification Search
None
See application file for complete search history.

(56) References Cited

U.S. PATENT DOCUMENTS 7,098,137 B2    8/2006   Ihara et al.
9,076,860 B1    7/2015   Lei et al.
(Continued)

OTHER PUBLICATIONS

"SL Series / DL Series for Direct Imaging" Hitachi Chemical, Working on Wonders, Feb. 25, 2020, 2 pages. www.hitachi-chem.co.jp/english/products/pm/016.html.
(Continued)

*Primary Examiner* — Nishath Yasmeen
(74) *Attorney, Agent, or Firm* — The Marbury Law Group PLLC

(57) ABSTRACT

A method of forming a semiconductor structure includes providing a semiconductor wafer including a plurality of semiconductor dies, providing a polymerized material layer, attaching the polymerized material layer to the semiconductor wafer such that the polymerized material layer is polymerized prior to the step of attaching the polymerized material layer to the semiconductor wafer, applying and patterning an etch mask layer over the polymerized material layer, such that openings are formed through the etch mask layer, etching portions of the polymerized material layer that are proximal to the openings through the etch mask layer by applying an etchant into the openings through the etch mask layer in an etch process, and removing the etch mask layer selective to the polymerized material layer. Alternatively, a patterned polymerized material layer may be transferred from a transfer substrate to the semiconductor wafer.

15 Claims, 12 Drawing Sheets

(52) U.S. Cl.
CPC .............. *H01L 2924/07025* (2013.01); *H01L 2924/14511* (2013.01); *H01L 2924/3511* (2013.01)

(56) References Cited

U.S. PATENT DOCUMENTS

| | | | |
|---|---|---|---|
| 10,283,493 | B1 | 5/2019 | Nishida |
| 10,629,616 | B1 | 4/2020 | Kai et al. |
| 2001/0049150 | A1 | 12/2001 | Nakagawa et al. |
| 2002/0003125 | A1 | 1/2002 | Knappenberger et al. |
| 2005/0269702 | A1* | 12/2005 | Otsuka .................. H01L 23/522 257/E21.582 |
| 2012/0160412 | A1* | 6/2012 | Ooyabu .................. H01L 33/52 428/354 |
| 2013/0234260 | A1 | 9/2013 | Cabral, Jr. et al. |
| 2014/0167276 | A1* | 6/2014 | Kim ........................ H01L 24/19 257/773 |
| 2015/0155853 | A1 | 6/2015 | Toyota |
| 2015/0200119 | A1 | 7/2015 | Eaton et al. |
| 2015/0296607 | A1* | 10/2015 | Yang ....................... H05K 1/167 361/749 |
| 2015/0357234 | A1 | 12/2015 | Rogalli et al. |
| 2017/0309582 | A1 | 10/2017 | Meyer et al. |
| 2017/0372996 | A1* | 12/2017 | Matsumoto ......... H01L 23/3157 |
| 2018/0097080 | A1* | 4/2018 | Yonekura ................ H01L 24/03 |
| 2018/0175004 | A1 | 6/2018 | Lin |
| 2018/0337045 | A1* | 11/2018 | Sun .................. H01L 21/31144 |

OTHER PUBLICATIONS

"RD Series for Direct Imaging" Hitachi Chemical, Working on Wonders, Feb. 25, 2020, 2 pages. www.hitachi-chem.co.jp/english/products/pm/015.html.

T. Oguni, "Polymide Etching Technology by We Process", Fine Process Div. Electronics Div., Toray Engineering Co., Ltd., vol. 55, No. 7, 2004, 5 pages.

H. Kakumaru, "Photosensitive Materials—Dry Film", 2nd Production Development Dept., Yamazaki Works, Hitachi Chemical Co., Ltd., vol. 5, No. 5, 1990, 11 pages.

U.S. Appl. No. 16/523,029, filed Jul. 26, 2019, SanDisk Technologies LLC.

USPTO Office Communication, Non-Final Office Action for U.S. Appl. No. 16/918,197, dated Oct. Mar. 14, 2022, 28 pages.

U.S. Appl. No. 16/918,197, filed Jul. 1, 2020, SanDisk Technologies LLC.

Notification of Transmittal of the International Search Report and the Written Opinion of the International Searching Authority for International Patent Application No. PCT/US2021/034405, dated Oct. 7, 2021, 9 pages.

USPTO Office Communication, Final Office Action for U.S. Appl. No. 16/918,197, dated Oct. Jul. 21, 2022, 27 pages.

* cited by examiner

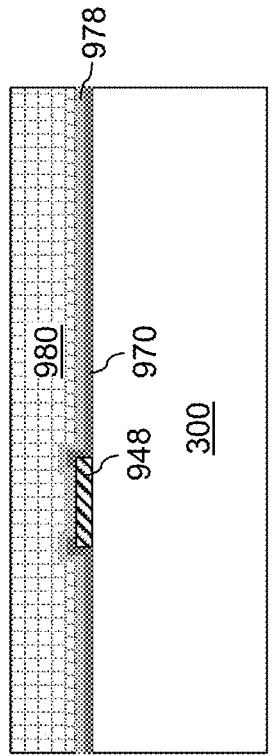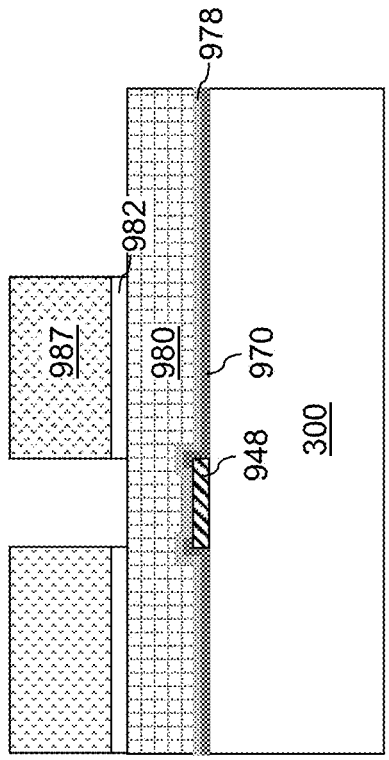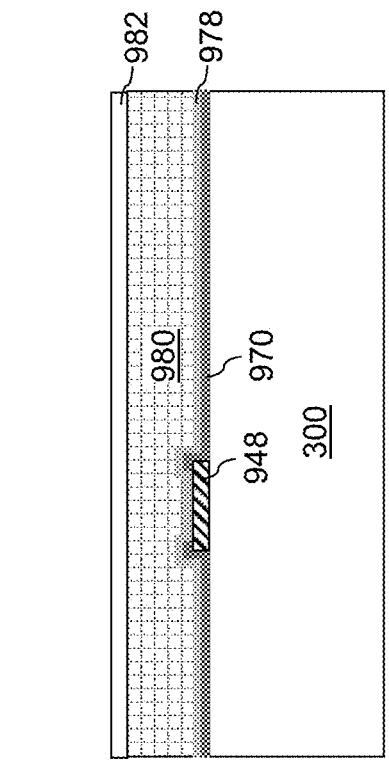
FIG. 3A
FIG. 3B
FIG. 3C
FIG. 3D

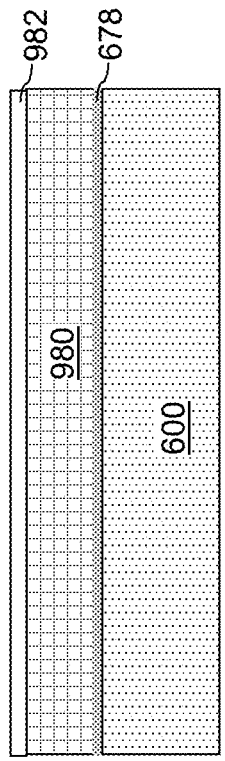
FIG. 5A
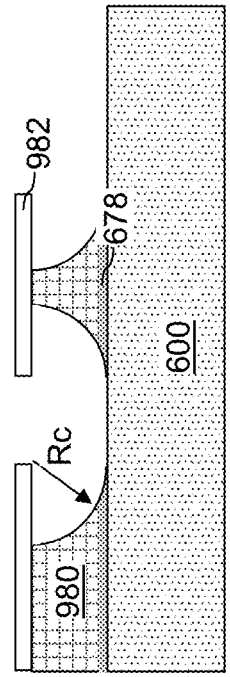
FIG. 5B
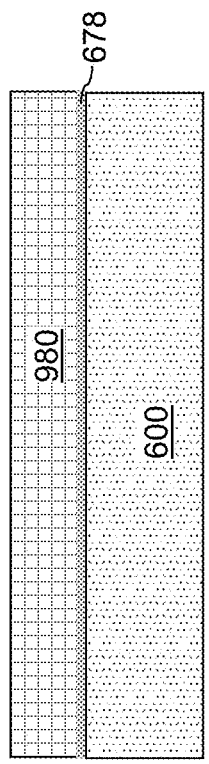
FIG. 5C
FIG. 5D

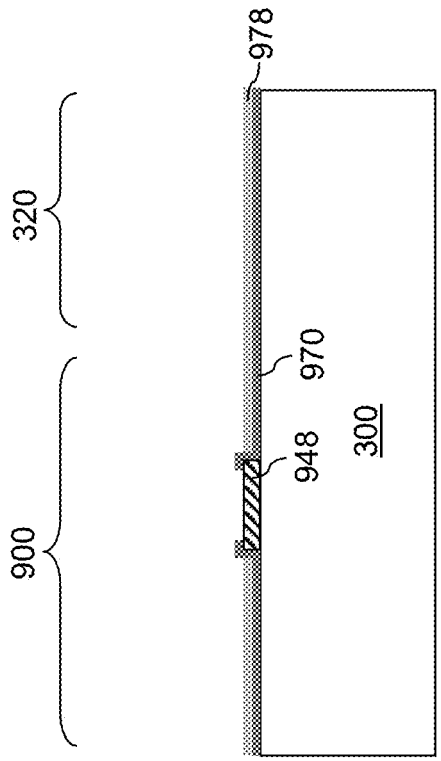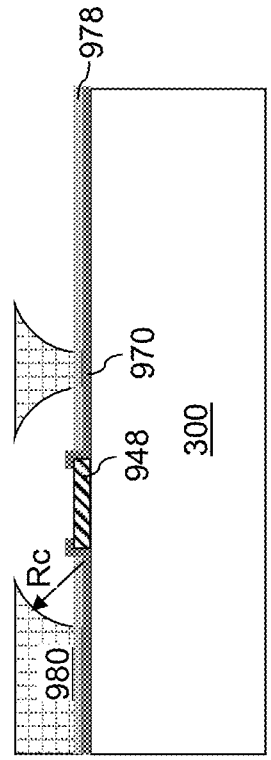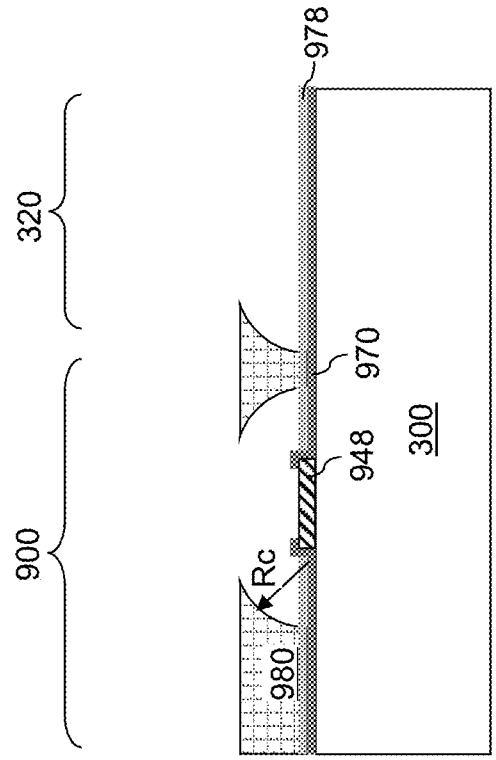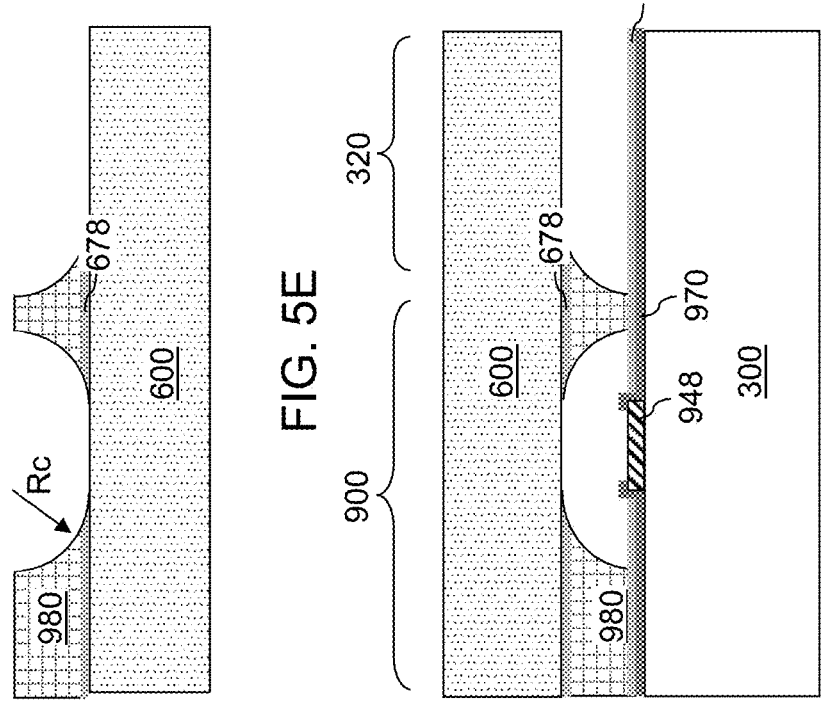

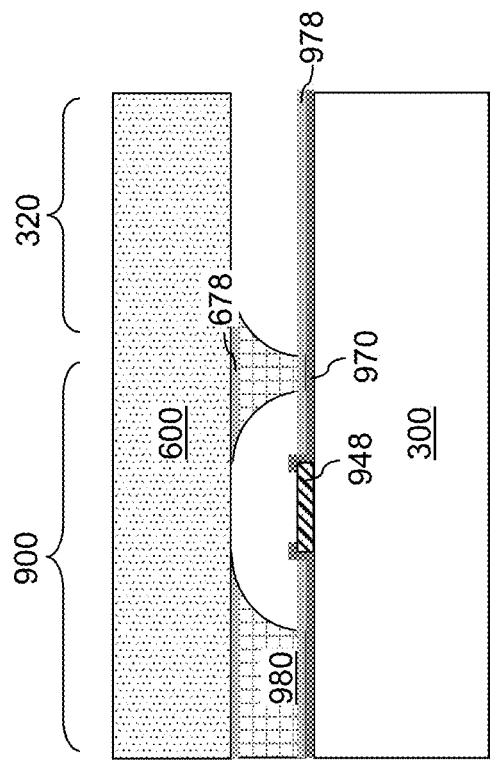
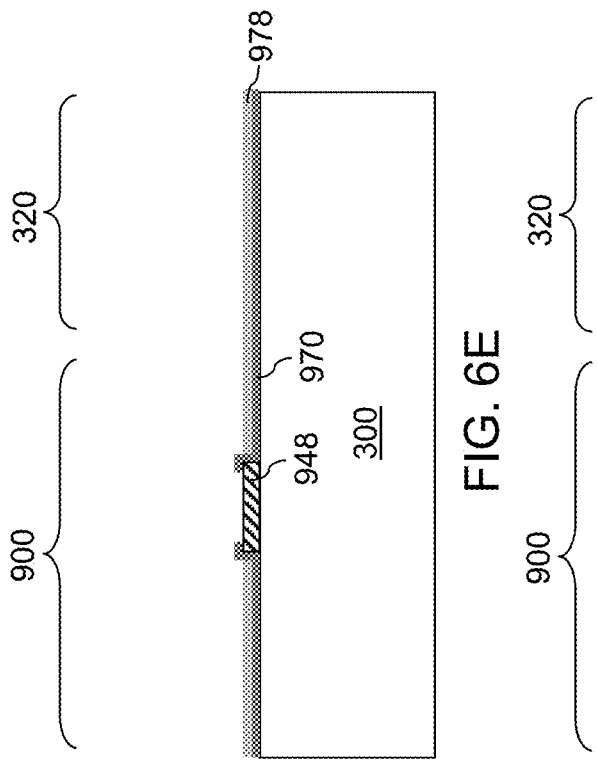
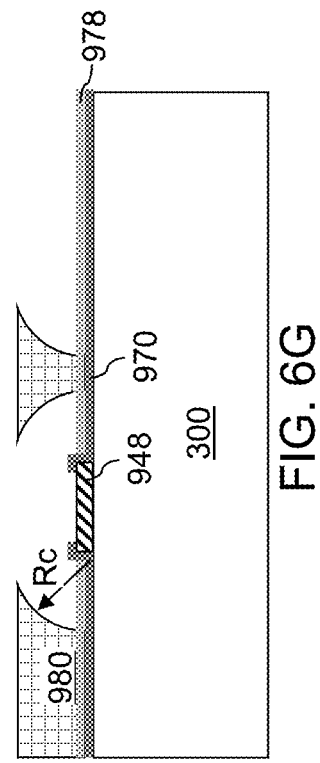

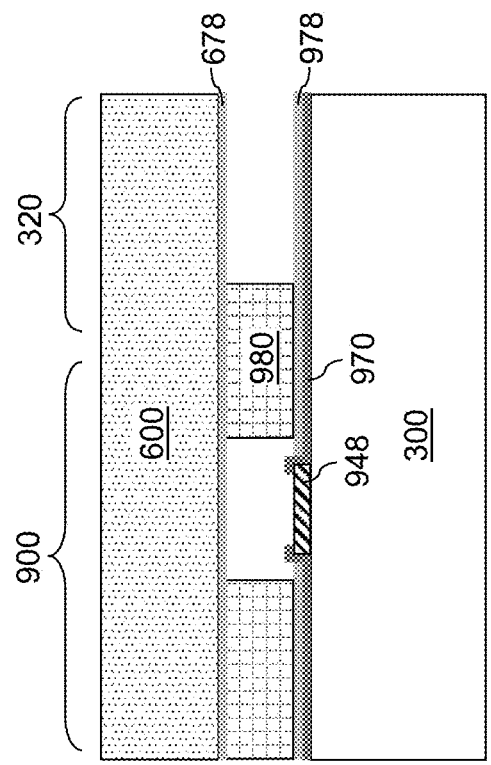
FIG. 7B
FIG. 7D
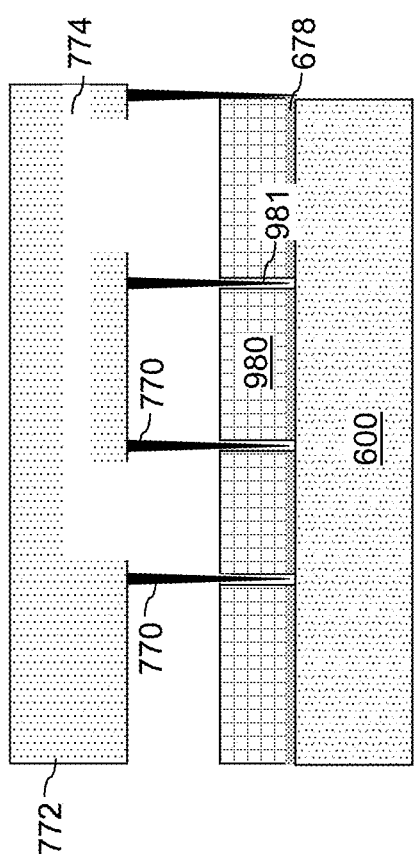
FIG. 7A
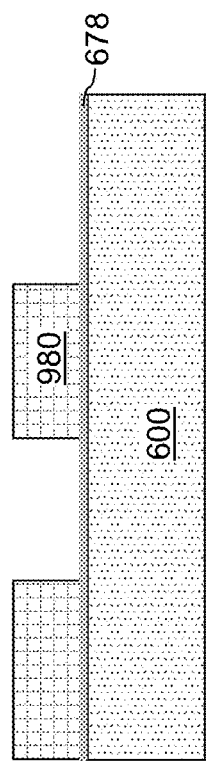
FIG. 7C

SEMICONDUCTOR STRUCTURE CONTAINING PRE-POLYMERIZED PROTECTIVE LAYER AND METHOD OF MAKING THEREOF

FIELD

The present disclosure relates generally to the field of semiconductor devices, and particularly to methods of forming and patterning a pre-polymerized protective layer over a semiconductor wafer for reduction of wafer warpage, and structures formed by the same.

BACKGROUND

Warpage of semiconductor dies increases with increasing die size. Furthermore, as the dies get thinner, the warpage may also increase. For example, semiconductor dies having a total thickness in the range from 30 microns to 50 microns is now common for multi-chip packages. As the total number of stacked semiconductor die in a multi-chip package increases, the warpage degrades the ability to stack multiple semiconductor dies in a multichip package, and can induce mishandling of semiconductor dies during pick up or during die-to-die bonding.

SUMMARY

According to an embodiment of the present disclosure, a method of forming a semiconductor structure includes providing a semiconductor wafer including a plurality of semiconductor dies, providing a polymerized material layer, attaching the polymerized material layer to the semiconductor wafer such that the polymerized material layer is polymerized prior to the step of attaching the polymerized material layer to the semiconductor wafer, applying and patterning an etch mask layer over the polymerized material layer, such that openings are formed through the etch mask layer, etching portions of the polymerized material layer that are proximal to the openings through the etch mask layer by applying an etchant into the openings through the etch mask layer in an etch process, and removing the etch mask layer selective to the polymerized material layer.

According to another aspect of the present disclosure, a semiconductor die comprises a semiconductor substrate, semiconductor devices located over the semiconductor substrate, dielectric material layers embedding metal interconnect structures that are connected to nodes of the semiconductor devices and overlying the semiconductor substrate, bonding pads located on the dielectric material layers and electrically connected to a subset of the metal interconnect structures, a passivation dielectric layer covering a topmost surface of the dielectric material layers, and a polymerized material layer overlying the passivation dielectric layer, having a planar top surface, and including openings therethrough, wherein a respective one of the bonding pads is physically exposed within each of the openings, and wherein each of the openings is laterally bounded by sidewalls of the polymerized material layer having a non-zero uniform radius of curvature throughout and adjoined to the planar top surface of the polymerized material layer.

According to yet another aspect of the present disclosure, a semiconductor die is provided, which comprises: a semiconductor substrate, semiconductor devices located on the semiconductor substrate, dielectric material layers embedding metal interconnect structures that are connected to nodes of the semiconductor devices and overlying the semiconductor substrate, bonding pads located on the dielectric material layers and electrically connected to a subset of the metal interconnect structures, and a polymerized material layer overlying the dielectric material layers, wherein the polymerized material layer has a planar top surface and includes openings therethrough, and wherein a horizontal cross-sectional area of each opening through the polymerized material layer decreases with a vertical distance from the semiconductor substrate According to still another aspect of the present disclosure, a method of forming a semiconductor structure is provided, which comprises: providing a semiconductor wafer including a plurality of semiconductor dies, wherein bonding pads are present on top surfaces of the plurality of semiconductor dies, forming a patterned polymerized material layer on a transfer substrate, wherein the patterned polymerized material layer includes openings that are arranged in a mirror image pattern of a pattern of the bonding pads on the semiconductor wafer, and transferring the patterned polymerized material layer to the semiconductor wafer by attaching the patterned polymerized material layer to the semiconductor wafer and by detaching the patterned polymerized material layer from the transfer substrate, wherein the bonding pads are physically exposed in the openings through the patterned polymerized material layer.

BRIEF DESCRIPTION OF THE DRAWINGS

FIGS. 3A-3F are sequential schematic vertical cross-sectional views of a portion of a semiconductor die and an adjacent kerf region during formation of a patterned polymerized material layer thereupon according to a first embodiment of the present disclosure.

FIGS. 5A-5E are sequential schematic vertical cross-sectional views of a portion of a transfer substrate during formation of a patterned polymerized material layer thereupon according to a third embodiment of the present disclosure.

FIGS. 5F-5H are sequential schematic vertical cross-sectional views of a portion of a semiconductor die and an adjacent kerf region during transfer of the patterned polymerized material layer thereto according to the third embodiment of the present disclosure.

FIGS. 6E-6G are sequential schematic vertical cross-sectional views of a portion of a semiconductor die and an adjacent kerf region during transfer of the patterned polymerized material layer thereto according to the fourth embodiment of the present disclosure.

FIGS. 7A and 7B are sequential schematic vertical cross-sectional views of a portion of a transfer substrate during formation of a patterned polymerized material layer thereupon according to a fifth embodiment of the present disclosure.

FIGS. 7C-7E are sequential schematic vertical cross-sectional views of a portion of a semiconductor die and an adjacent kerf region during transfer of the patterned polymerized material layer thereto according to the fifth embodiment of the present disclosure.

DETAILED DESCRIPTION

Figure 1:
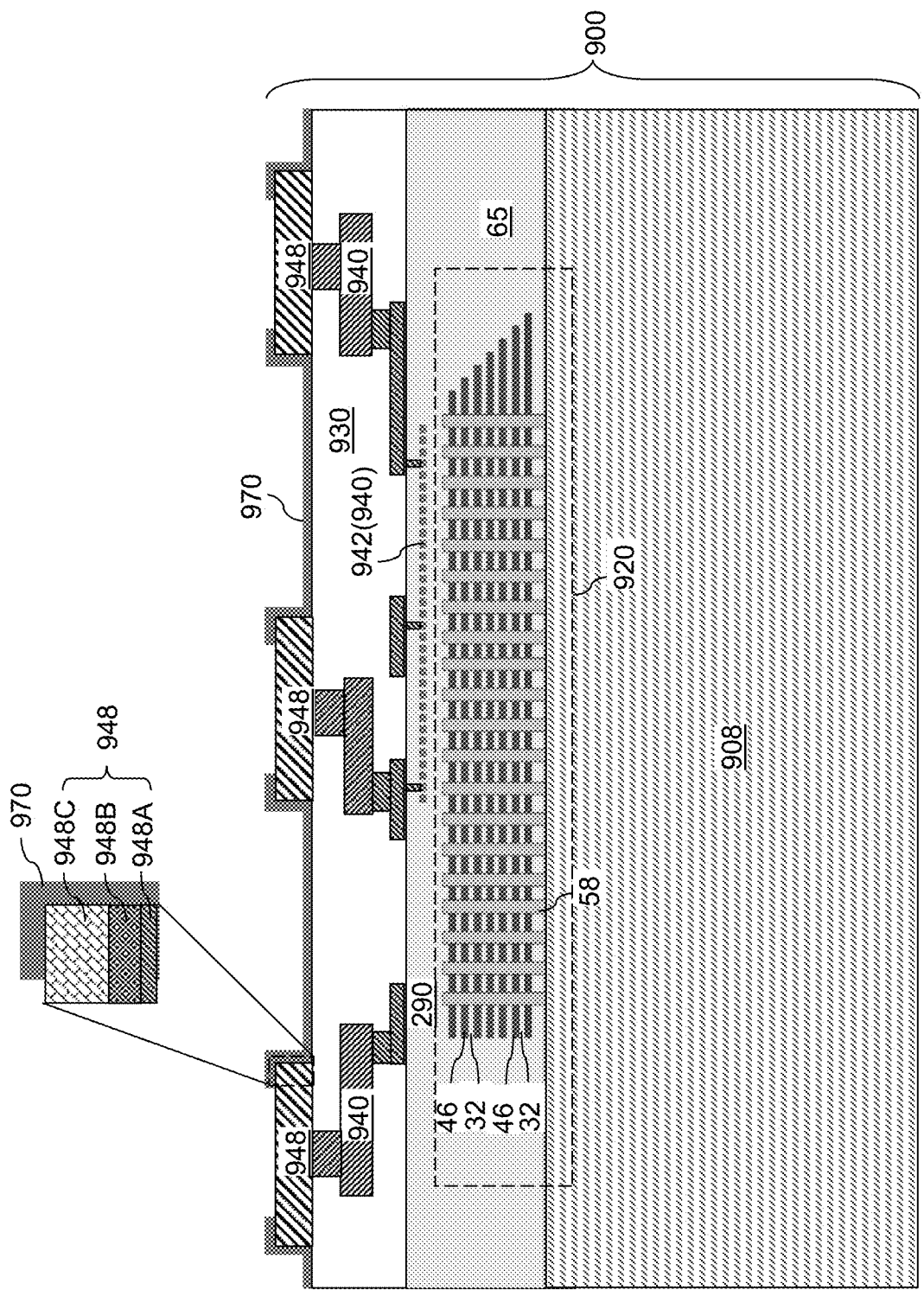
FIG. 1 is a schematic vertical cross-sectional view of an exemplary semiconductor die according to an embodiment of the present disclosure.

The present inventor realized that one of the factors that increases wafer warpage, and consequently increases warpage of individual semiconductor dies, is the shrinkage of a protective polymer layer (also referred to as a polymer buffer coat film) that is formed over the semiconductor dies located on a semiconductor wafer. The polymer buffer coat film may be formed by spin coating a precursor solution over the semiconductor wafer to form a precursor film, followed by patterning the coated precursor film with photolithography and developing/etching processes, followed by curing the precursor film by heat treatment at 250 to 300 degrees Celsius to polymerize the precursor film and form a final polymer buffer coat film over the semiconductor wafer. However, the precursor film volume shrinks during the curing step such that the final polymer buffer coat film is in compressive stress and applies a tensile stress to the underlying semiconductor wafer, which causes wafer warpage.

The various methods of the embodiments of the present disclosure can be employed to reduce such wafer warpage by forming a protective polymer layer as a pre-polymerized, pre-shrunk material layer that does not undergo further shrinking after application over the semiconductor wafer. As such, the protective polymer layer applies little or no stress to the underlying semiconductor wafer.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

Referring to FIG. 1, an exemplary semiconductor die 900 according to a first embodiment of the present disclosure is illustrated. The exemplary semiconductor die 900 includes a substrate 908, semiconductor devices 920 overlying the substrate 908, dielectric material layers (290, 930) overlying the semiconductor devices, and metal interconnect structures 940 embedded in the dielectric material layers (290, 930). In one embodiment, the substrate 908 may be a portion of commercially available silicon wafer 300 shown in FIG. 2 having a thickness in a range from 500 microns to 1 mm.

Generally, the semiconductor devices 920 may comprise any semiconductor device known in the art. In one embodiment, the exemplary semiconductor die 900 comprises a memory die, and may include memory devices, such as a three-dimensional NAND memory device. Alternatively, the semiconductor devices 920 may include logic devices such as complementary metal oxide semiconductor devices for a processor unit or for a driver circuit of a memory device.

In a non-limiting illustrative example, the semiconductor devices 920 may include a three-dimensional memory array. In this case, the semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device. A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

The dielectric material layers (290, 930) may include contact-level dielectric layers 290 embedding contact via structures and bit lines 942 and interconnect-level dielectric material layers 930 that embed metal interconnect structures 940 located above the contact-level dielectric layers 290. The contact via structures contact various nodes of the semiconductor devices 920. While the present disclosure is described employing an embodiment in which the semiconductor devices 920 include a three-dimensional memory device, the semiconductor devices 920 may be any semiconductor device known in the art such as logic devices. Such alternative embodiments are expressly contemplated herein. The metal interconnect structures 940 can include interconnect metal lines and interconnect metal via structures. Each of the contact-level dielectric layers 290 and the interconnect-level dielectric material layers 930 may include at least one dielectric material such as undoped silicate glass, a doped silicate glass, organosilicate glass, silicon nitride, a dielectric metal oxide, or a combination thereof. The topmost surface of the interconnect-level dielectric material layers 930 may have a planar top surface, which may be provided, for example, by a planarization process such as a chemical mechanical polishing (CMP) process.

Bonding pads 948 can be formed on the topmost subset of the metal interconnect structures 940, i.e., on the subset of the metal interconnect structures 940 that are formed at the topmost level of the interconnect-level dielectric material layers 930. For example, the bonding pads 948 can be formed by depositing at least one metallic material (948A, 948B, 948C) over the topmost surface of the interconnect-level dielectric material layers 930, by applying and patterning a photoresist layer thereupon, and by transferring the pattern in the photoresist layer through the at least one metallic material. The pattern in the photoresist layer can be selected such that each discrete patterned portion of the photoresist layer covers and contacts a respective metal interconnect structures 940 located at the topmost level of the interconnect-level dielectric material layers 930.

The at least one metallic material (948A, 948B, 948C) can include copper, aluminum, ruthenium, cobalt, molybdenum, and/or any other metallic material that may be deposited by physical vapor deposition, chemical vapor deposition, electroplating, vacuum evaporation, or other deposition methods. For example, a metallic nitride liner 948A including a conductive metallic nitride material (such as TiN, TaN, or WN) may be deposited directly on the physically exposed surfaces of the metal interconnect structures 940 located at the topmost level of the interconnect-level dielectric material layers 930. The thickness of the metallic nitride liner 948A can be in a range from 10 nm to 100 nm, although lesser and greater thicknesses can also be employed. At least one bonding pad material (948B, 948C) can be deposited over the metallic nitride liner 948A. The at least one bonding pad material (948B, 948C) can include a stack of a high-electrical-conductivity metal layer 948B (such as a copper layer or an aluminum layer) and an underbump metallurgy (UBM) layer stack 948C for bonding a solder ball thereupon. Exemplary UBM layer stacks 948C include, but are not limited to, an Al/Ni/Au stack, an Al/Ni/Cu stack, a Cu/Ni/Au stack, a Cu/Ni/Pd stack, a Ti/Ni/Au stack, a Ti/Cu/Ni/Au stack, a Ti—W/Cu stack, a Cr/Cu stack, and a Cr/Cu/Ni stack. The total thickness of the at least one metallic material (948A, 948B, 948C) may be in a range from 0.5 microns to 20 microns, such as from 1 micron to 10 microns, although lesser and greater thicknesses can also be employed. Accordingly, the thickness of each bonding pad 948 may be in a range from 0.5 microns to 20 microns, such as from 1 micron to 10 microns, although lesser and greater thicknesses can also be employed.

Each bonding pad 948 may have a horizontal cross-sectional shape of a rectangle, a rounded rectangle (i.e., a rectangle with rounded corners), a circle, an ellipse, or any non-intersecting two-dimensional generally curvilinear shape. The lateral dimensions (such as the lengths of sides or the diameter) of the bonding pads 948 may be in a range from 10 microns to 100 microns, such as from 20 microns to 60 microns, although lesser and greater lateral dimensions can also be employed. The bonding pads 948 may be formed as a periodic array. In one non-limiting embodiment, the bonding pads 948 may be formed as a two-dimensional periodic array, or as at least one one-dimensional periodic array (i.e., at least one row of bonding pads 948 having a uniform pitch). In another embodiment, the pitch may be non-uniform.

A passivation dielectric layer 970 can be deposited over the bonding pads 948 and the interconnect-level dielectric material layers 930. The passivation dielectric layer 970 includes an impurity diffusion blocking dielectric material such as silicon nitride and/or silicon carbide nitride. The thickness of the passivation dielectric layer 970 may be in a range from 100 nm to 1,000 nm, although lesser and greater thicknesses can also be employed.

A photoresist layer (not shown) can be applied over the passivation dielectric layer 970, and can be lithographically patterned to form an array of openings in areas that overlie the bonding pads 948. An etch process can be performed to etch unmasked portions of the passivation dielectric layer 970. An anisotropic etch process or an isotropic etch process may be employed. In one embodiment, the periphery of each opening in the photoresist layer may be laterally offset inward from the periphery of an underlying bonding pad 948. In this case, each opening in the passivation dielectric layer 970 may be inside a periphery of a respective underlying bonding pad 948. A top surface of a respective bonding pad 948 can be physically exposed underneath each opening through the passivation dielectric layer 970.

Figure 2:
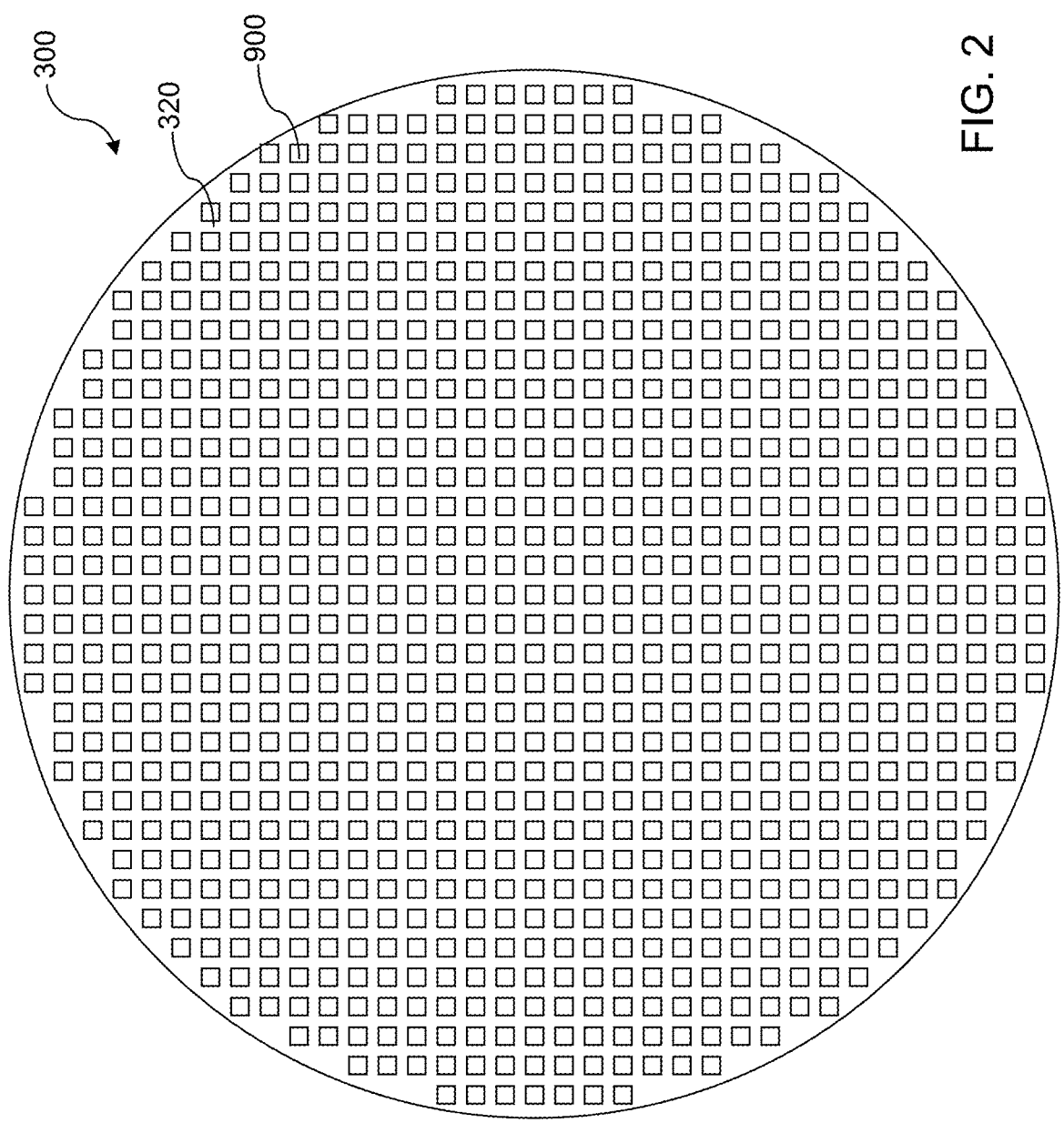
FIG. 2 is a top-down view of a semiconductor wafer including a two-dimensional array of semiconductor dies therein according to an embodiment of the present disclosure.

Referring to FIG. 2, a top-down view of a semiconductor wafer 300 including a two-dimensional array of semiconductor dies 900 is illustrated. Generally, the semiconductor wafer 300 includes an array of semiconductor dies 900 and kerf regions 320 located between each neighboring pair of semiconductor dies 900. The semiconductor dies 900 can be arranged in as a two-dimensional rectangular array. The kerf regions 320 function as dicing channel regions through which the semiconductor wafer 300 is cut to provide singulated semiconductor dies after formation and patterning of a polymerized material layer to be described below.

FIGS. 3A-3F are sequential schematic vertical cross-sectional views of a portion of a semiconductor die 900 and an adjacent kerf region 320 during formation of a patterned polymerized material layer thereupon according to a first embodiment of the present disclosure. All other components located on the semiconductor wafer 300 (such as the semiconductor devices 920) except the bonding pads 948 and the passivation dielectric layer 970 are omitted for the purpose of clarity in the drawing. Bonding pads 948 are provided as a component of a respective semiconductor dies 900, and the passivation dielectric layer 970 can cover peripheral portions of the bonding pads 948. The passivation dielectric layer 970 also covers the dielectric material layers 930 of the plurality of semiconductor dies 900 that embed metal interconnect structures 940. The illustrated region in FIGS. 3A-3F corresponds to a peripheral region of one semiconductor die 900 and an adjacent kerf region 320 of FIG. 2.

Referring to FIG. 3A, a semiconductor die 900 and adjacent kerf region 320 is illustrated. Generally, the semiconductor die 900 can be any semiconductor die including at least one bonding pad 948 (such as a plurality of bonding pads 948 in an array configuration) and a passivation dielectric layer 970 thereupon. The top surface of each bonding pad 948 can have a physically exposed center portion and a peripheral portion covered by the passivation dielectric layer 970. Further, all sidewalls of each bonding pad can optionally be contacted by, and covered by, the passivation dielectric layer 970. Components of the semiconductor die 900 other than a bonding pad 948 and a passivation dielectric layer 970 are not illustrated for clarity.

Referring to FIG. 3B, an adhesive layer 978 can be formed over the semiconductor wafer 300 as a continuous material layer. Thus, the adhesive layer 978 can be formed on the top surface of the passivation dielectric layer 970 and on each physically exposed surface of the bonding pads 948. The adhesive layer 978 can include any adhesive material which is tolerant to a heat treatment at temperatures up to 400 degrees Celsius, such as up to at least 250 degrees Celsius which occur during the die assembly process. For example, the adhesive layer 978 can include a pressure-sensitive adhesive material or thermoplastic adhesive material.

In one embodiment, a polymerized material layer (e.g., polymer buffer coat film) 980 is attached to the adhesive layer 978. Thus, the polymerized material layer 980 is attached to the semiconductor wafer 300 including the semiconductor dies 900 using the adhesive layer 978. The polymerized material layer 980 includes a pre-polymerized material, i.e., a material in which monomers for forming a polymer material are already polymerized at the time of attachment. The adhesive layer 978 provides the adhesion force that is necessary to attach the pre-polymerized material of the polymerized material layer 980 to the passivation dielectric layer 970. In an alternative embodiment, the adhesive layer 978 may be attached to polymerized material layer 980 in advance instead of forming the adhesive layer 978 on the semiconductor wafer 300. For example, an adhesive paste may be coated on a polymerized material layer 980 in advance to form an adhesive polymerized material film (978, 980), which is then attached to semiconductor wafer 300.

The polymerized material layer 980 may comprise any suitable polymer material which may act as a protective layer (e.g., buffer coat film), such as a polyimide material or a silicone resin material (e.g., a polysiloxane material). In one embodiment, the polymerized material layer 980 is formed by spin coating a precursor solution (e.g., a solution containing monomers or other polymer precursor) over a transfer substrate to form a precursor film, followed by curing the precursor film (e.g., at a temperature between 250 to 300 degrees Celsius) to polymerize the precursor film and form the polymerized material layer 980 prior to attaching the polymerized material layer 980 to the semiconductor wafer 300. The polymerized material layer 980 may be removed from the transfer substrate before or after attaching the polymerized material layer 980 to the semiconductor wafer 300 using the adhesive layer 978. The polymerized material layer 980 may include an optional cover layer which is used to transfer the polymerized material layer 980 from the transfer substrate to the adhesive layer 978. The cover layer may be peeled off from the polymerized material layer 980 after the polymerized material layer 980 is adhered to the adhesive layer 978. In one embodiment, the polymerized material layer 980 is a dry, solid film which lacks a solvent during transfer from the transfer substrate.

The material of the polymerized material layer 980 has already been polymerized at the time of attachment to the semiconductor wafer 300, and thus, does not go through a significant volume change in subsequent processes. Thus, the polymerized material layer 980 generates little or no stress to the semiconductor wafer 300 upon application, as well as during and after subsequent processing steps. Application of a pre-polymerized material in the form of the polymerized material layer 980 reduces the mechanical stress applied to the semiconductor wafer 300. Thus, the polymerized material layer 980 can function as a protective coating layer without applying any significant level of stress to the semiconductor wafer 300, and thus reducing wafer 300 warpage.

Referring to FIG. 3C, an etch mask layer 982 can be deposited over the top surface of the polymerized material layer 980 which is adhered to the adhesive layer 978. In one embodiment, the etch mask layer 982 includes a hard mask material, e.g., an inorganic dielectric material. In one embodiment, the etch mask layer 982 can be deposited at a temperature not higher than 400 degrees Celsius, and may be deposited at a temperature in a range from 200 degrees Celsius to 400 degrees Celsius by plasma enhanced chemical vapor deposition (PECVD) or spin on deposition (e.g., if the etch mask layer 982 is a spin-on glass). In one embodiment, the etch mask layer 982 may include silicon oxide (e.g., silicon dioxide formed by PECVD or spin-on glass) or silicon nitride formed by PECVD.

Referring to FIG. 3D, a photoresist material layer 987 can be applied over the etch mask layer 982, for example, by spin coating. The photoresist material layer 987 may include a positive photoresist material or a negative photoresist material. For example, the photoresist material layer 987 may include any conventional mid-ultraviolet photoresist material. Alternatively, the photoresist material layer 987 can include unpolymerized monomer imide units, and the polymerized material layer 980 may include a polyimide material in a polymerized form.

The photoresist material layer 987 can be lithographically patterned by lithographic exposure and development. The pattern in the developed photoresist material layer 987 includes openings in areas located within openings through the passivation dielectric layer 970. In one embodiment, a subset of openings through the developed photoresist material layer 987 can be located within the area of an underlying opening in the passivation dielectric layer 970. Further, a continuous mesh-shaped opening can be formed through the developed photoresist material layer 987 that extends over the entirety of the kerf regions 320. The continuous mesh-shaped opening includes a plurality of intersecting channels that overlie the kerf regions 320 located over the semiconductor wafer 300.

An etch process can be performed to transfer the pattern in the developed photoresist material layer 987 through the etch mask layer 982. The etch process may be an isotropic etch process (such as a wet etch process) or an anisotropic etch process (such as a reactive ion etch process). Generally, the etch mask layer 982 can be patterned by transferring the pattern in the photoresist material layer 987 into the etch mask layer 982.

Figure 3E:
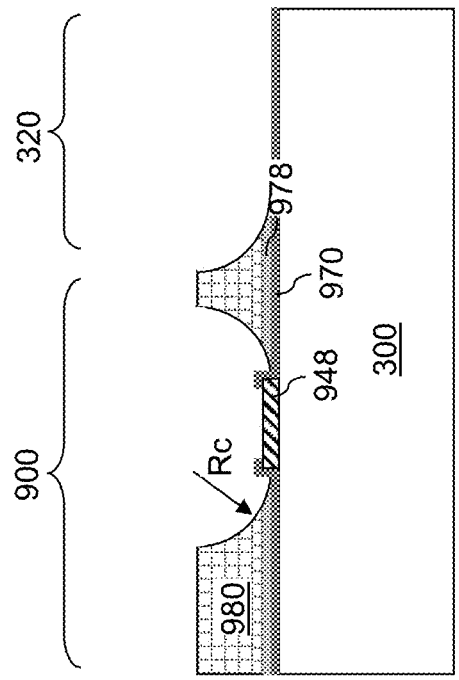

Referring to FIG. 3E, portions of the polymerized material layer 980 that are proximal to the openings through the etch mask layer 982 can be isotropically etched by applying an isotropic etchant into the openings through the etch mask layer 982 in an isotropic etch process. The isotropic etch process etches proximal portions of the polymerized material layer 980 from underneath each opening in the etch mask layer 982. Remaining portions of the polymerized material layer 980 after the isotropic etch process include concave sidewalls having a uniform radius of curvature Rc throughout. The duration of the isotropic etch process can be selected such that the etch distance into the polymerized material layer 980 is greater than the thickness of the polymerized material layer 980. In this case, the uniform radius of curvature Rc of the concave sidewalls of the remaining portions of the polymerized material layer 980 can be greater than the thickness of the polymerized material layer 980. Alternatively, the polymerized material layer 980 can be anisotropically etched.

The etchant etches the material of the polymerized material layer 980 selective to materials of the bonding pads 948, the passivation dielectric layer 970, and the etch mask layer 982. Generally, the material of the etch mask layer 982 can be a hard mask material (i.e., an inorganic dielectric material such as silicon oxide or silicon nitride) that is resistant to the etch process. For example, hydrazine can be employed as the isotropic etchant that etches the material of the polymerized material layer 980 if the polymerized material layer comprises polyimide. The patterned photoresist material layer 987 overlying the etch mask layer 982 can be collaterally etched during the isotropic etch process that recesses the material of the polymerized material layer 980. Further, portions of the adhesive layer 978 that is applied to the bonding pads 948 at the processing steps of FIG. 3B can be removed employing the isotropic etchant of the isotropic etch process, or employing another isotropic etchant, while the etch mask layer 982 is present on the polymerized material layer 980. An overhang portion of the etch mask layer 982 overlies each undercut region adjacent to the concave sidewalls of the polymerized material layer 980. Alternatively, an oxygen plasma dry etch which etches the photoresist material layer 987, the polymerized material layer 980 and the adhesive layer 978 may be used instead.

Generally, discrete openings are formed in the polymerized material layer 980 upon etching the portions of the polymerized material layer 980 that are proximal to the openings through the etch mask layer 982. A respective one of the bonding pads 948 is physically exposed underneath each of the discrete openings in the polymerized material layer 980. Top surfaces of the bonding pads 948 are physically exposed upon etching the unmasked portions of the polymerized material layer 980.

Further, a mesh-shaped opening exposing the kerf regions 320 may be formed in the polymerized material layer 980 during etching of the portions of the polymerized material layer 980 that are proximal to the openings through the etch mask layer 982. The mesh-shaped opening in the polymerized material layer 980 is formed underneath the mesh-shaped opening through the etch mask layer 982 that continuously extends over the kerf regions 320 of the semiconductor wafer 300. The mesh-shaped opening in the polymerized material layer 980 can have the same pattern as the pattern of the kerf regions 320. Removal of the portions of the polymerized material layer 980 from the kerf regions 320 facilitates dicing of the semiconductor dies 900 in subsequent processing steps. The mesh-shaped opening can extend through areas between each laterally-neighboring pair of semiconductor dies 900 of the plurality of semiconductor dies 900, and can laterally surround, and can laterally enclose, each of the plurality of semiconductor dies 900.

Figure 3F:
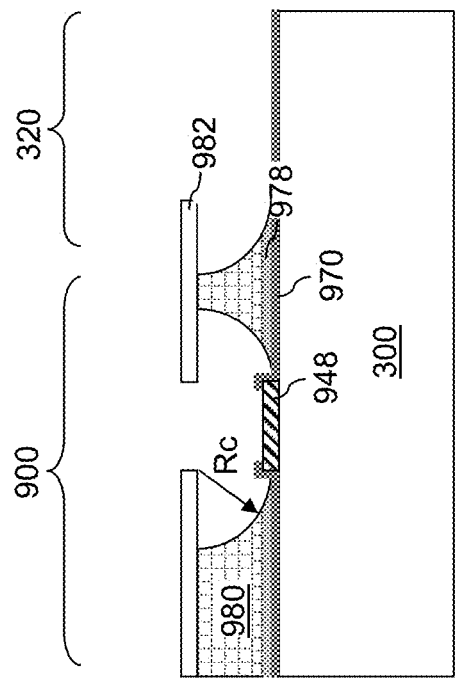

Referring to FIG. 3F, the etch mask layer 982 can be removed selective to the polymerized material layer 980. A wet etch process employing an inorganic etchant may be employed. For example, if the etch mask layer 982 include silicon oxide, the wet etch process can employ hydrofluoric acid. If the etch mask layer 982 includes silicon nitride, the wet etch process can employ hot phosphoric acid. Subsequently, the semiconductor dies 900 in the semiconductor wafer 300 can be singulated by dicing along the dicing channels, which are the areas of the kerf regions 320. Each remaining portion of the polymerized material layer 980 is incorporated into a respective semiconductor die 900.

FIGS. 4A-4E are sequential schematic vertical cross-sectional views of a portion of a semiconductor die 900 and an adjacent kerf region 320 during formation of a patterned polymerized material layer 980 thereupon according to a second embodiment of the present disclosure.

Figure 4A:
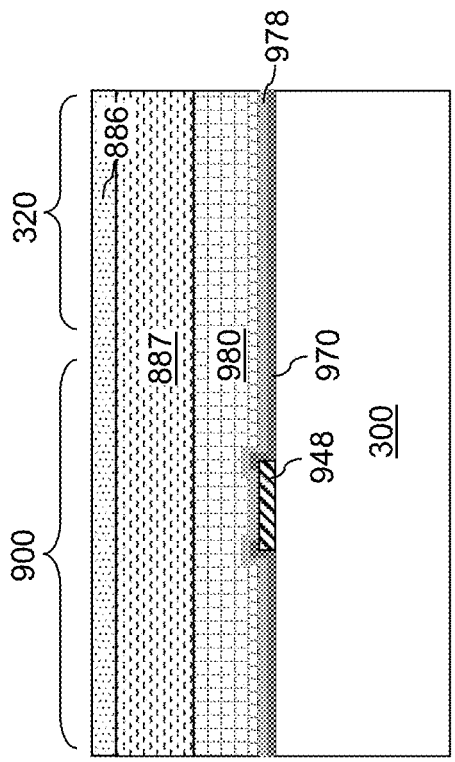
FIGS. 4A-4E are sequential schematic vertical cross-sectional views of a portion of a semiconductor die and an adjacent kerf region during formation of a patterned polymerized material layer thereupon according to a second embodiment of the present disclosure.

Referring to FIG. 4A, a polymerized material layer 980 can be formed on a semiconductor die 900 by performing the processing steps of FIG. 3B. The exemplary structure illustrated in FIG. 4A can be the same as the exemplary structure illustrated in FIG. 3B.

Figure 4B:
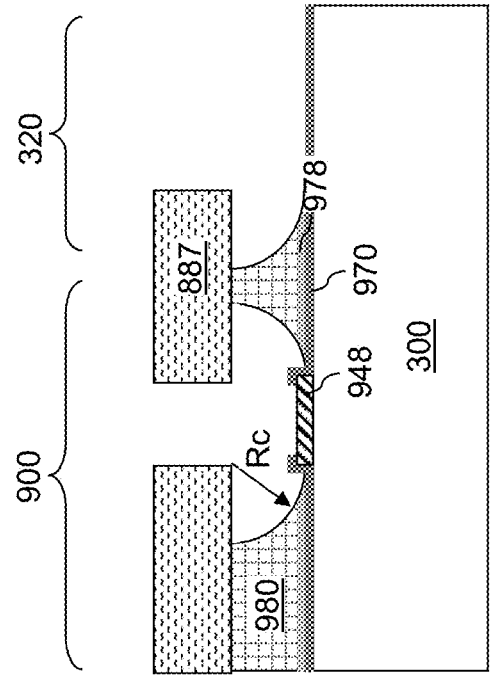

Referring to FIG. 4B, a dry film is provided, which includes a stack of a cover layer 886, a photosensitive material layer 887, and a base layer (not shown) located below the photosensitive material layer 887. The photosensitive material layer 887 includes a different material than the material of the polymerized material layer 980. For example, if the polymerized material layer 980 includes a polymerized polyimide layer that is not photosensitive, then the photosensitive material layer 887 can include a photosensitive polyimide material that can be removed selective to the material of the polymerized material layer 980. The photosensitive material layer 887 is preferably a solid layer that excludes a solvent, and the dry film (886, 887) is preferably solvent free and can be handled as a stand-alone film.

The photosensitive material layer 887 and the cover layer 886 are peeled off from the base layer. The combination of the photosensitive material layer 887 and the cover layer 886 can be attached to the polymerized material layer 980 after removing the base layer such that the photosensitive material layer 887 contacts the polymerized material layer 980. In one embodiment, pressure may be applied to the photosensitive material layer 887 through the cover layer 886 to promote adhesion of the photosensitive material layer 887 to the polymerized material layer 980.

Figure 4C:
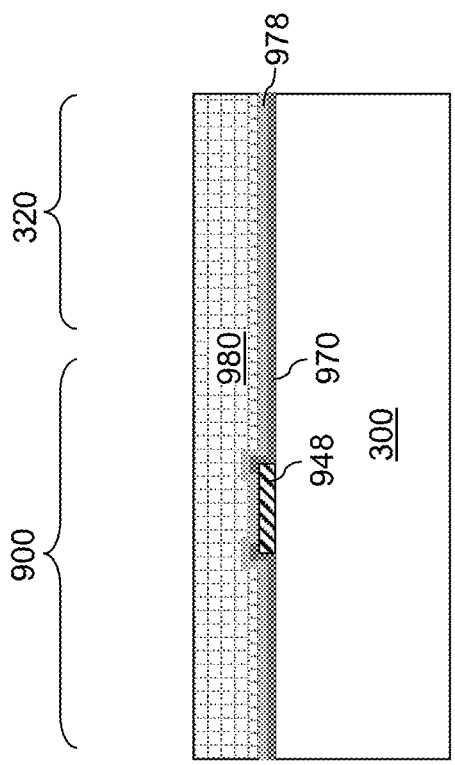

Referring to FIG. 4C, the photosensitive material layer 887 can lithographically exposure through the cover layer 886 (which is transparent to UV radiation) in a desired pattern. Subsequently the cover layer 886 can be detached from the photosensitive material layer 887, for example, by peeling off. After detaching the cover layer 886, the photosensitive material layer 887 is developed to be lithographically patterned into a pattern.

The pattern in the developed photosensitive material layer 887 includes openings in areas located within openings through the passivation dielectric layer 970. In one embodiment, a subset of openings through the developed photosensitive material layer 887 can be located within the area of an underlying opening in the passivation dielectric layer 970. Further, a continuous mesh-shaped opening can be formed through the developed photosensitive material layer 887 that extends over the entirety of the kerf regions 320.

The continuous mesh-shaped opening includes a plurality of intersecting channels that overlie the kerf regions 320 over the semiconductor wafer 300. The developed photosensitive material layer 887 is employed as an etch mask layer during a subsequent etch process.

Figure 4D:
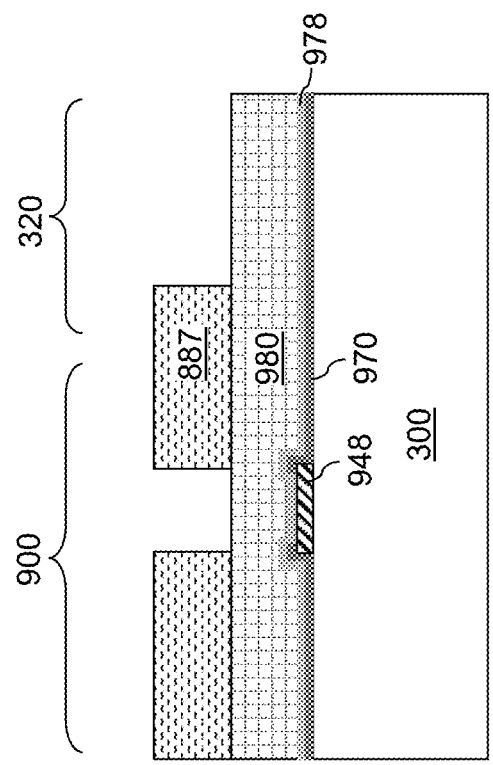

Referring to FIG. 4D, portions of the polymerized material layer 980 that are proximal to the openings through the patterned photosensitive material layer 887 can be isotropically etched by applying an isotropic etchant into the openings through the patterned photosensitive material layer 887 in an isotropic etch process. The isotropic etch process etches proximal portions of the polymerized material layer 980 from underneath each opening in the etch mask layer 982. Remaining portions of the polymerized material layer 980 after the isotropic etch process include concave sidewalls having a uniform radius of curvature Rc throughout. The duration of the isotropic etch process can be selected such that the etch distance into the polymerized material layer 980 is greater than the thickness of the polymerized material layer 980. In this case, the uniform radius of curvature Rc of the concave sidewalls of the remaining portions of the polymerized material layer 980 can be greater than the thickness of the polymerized material layer 980. Alternatively, the polymerized material layer 980 can be anisotropically etched.

The etchant etches the material of the polymerized material layer 980 selective to materials of the bonding pads 948 and the passivation dielectric layer 970. In one embodiment, the etch chemistry of the etchant may etch the cross-linked polymer material of the polymerized material layer 980 at a higher etch rate than the material of the patterned photosensitive material layer 887. For example, an organic solvent can be employed as the isotropic etchant that etches the material of the polymerized material layer 980. Further, portions of the adhesive layer 878 overlying to the bonding pads 948 can be removed employing the isotropic etchant of the isotropic etch process, or employing another etchant, while the patterned photosensitive material layer 887 is present over the polymerized material layer 980 and functions as an etch mask layer. An overhang portion of the patterned photosensitive material layer 887 overlies each undercut region adjacent to the concave sidewalls of the polymerized material layer 980.

Generally, discrete openings are formed in the polymerized material layer 980 upon etching the portions of the polymerized material layer 980 that are proximal to the openings through the patterned photosensitive material layer 887. A respective one of the bonding pads 948 is physically exposed underneath each of the discrete openings in the polymerized material layer 980. Top surfaces of the bonding pads 948 are physically exposed upon etching the unmasked portions of the polymerized material layer 980.

Further, a mesh-shaped opening is formed in the polymerized material layer 980 during etching of the portions of the polymerized material layer 980 that are proximal to the openings through the patterned photosensitive material layer 887. The mesh-shaped opening in the polymerized material layer 980 is formed underneath the mesh-shaped opening through the etch mask layer 982 that continuously extends over the kerf regions 320 of the semiconductor wafer 300. The mesh-shaped opening in the polymerized material layer 980 can have the same pattern as the pattern of the kerf regions 320. Removal of the portions of the polymerized material layer 980 from the kerf regions 320 facilitates dicing of the semiconductor dies 900 in subsequent processing steps. The mesh-shaped opening can extend through areas between each laterally-neighboring pair of semiconductor dies 900 among the plurality of semiconductor dies 900, and can laterally surround, and can laterally enclose, each of the plurality of semiconductor dies 900.

Figure 4E:
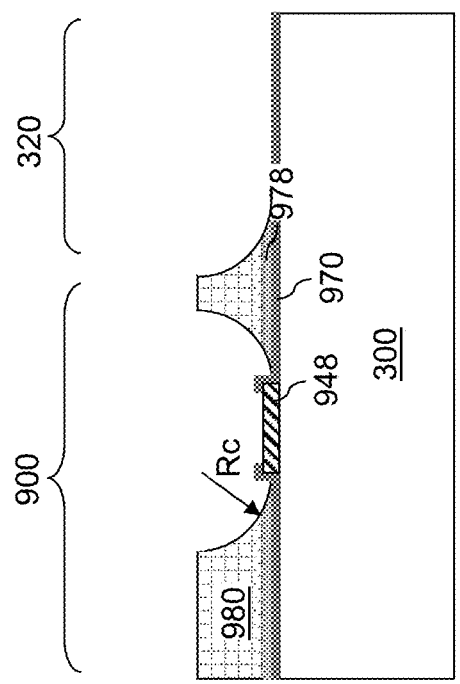

Referring to FIG. 4E, the patterned photosensitive material layer 987 overlying the etch mask layer 982 can be collaterally etched during the etch process at a lower etch rate than the material of the polymerized material layer 980. The duration of the etch process and the thickness of the developed photosensitive material layer 887 can be selected such that the etch process stops after removal of the developed photosensitive material layer 887 with minimal over-etch of the polymerized material layer 980 from the planar top surface of the polymerized material layer 980.

Alternatively, the etch process may have a high selectivity relative to the material of the patterned photosensitive material layer 887, and a significant portion of the patterned photosensitive material layer 887 may remain after the etch process. In this case, the patterned photosensitive material layer 887 may be removed by performing a subsequent removal process, which may include peeling off the patterned photosensitive material layer 887 from the remaining portions of the polymerized material layer 980. Each remaining portion of the polymerized material layer 980 is incorporated into a respective semiconductor die 900.

Referring to FIGS. 3F and 4E and according to various embodiments of the present disclosure, a semiconductor die 900 is provided, which comprises: a semiconductor substrate 908, semiconductor devices 920 located over the semiconductor substrate 908, dielectric material layers (290, 930) embedding metal interconnect structures 940 that are connected to nodes of the semiconductor devices 920 and overlying the semiconductor substrate 908, bonding pads 948 located on the dielectric material layers (290, 930) and electrically connected to a subset of the metal interconnect structures 940, a passivation dielectric layer 970 covering a topmost surface of the dielectric material layers (290, 930), and a polymerized material layer 980 overlying the passivation dielectric layer 970, having a planar top surface, and including openings therethrough, wherein a respective one of the bonding pads 948 is physically exposed within each of the openings, and wherein each of the openings is laterally bounded by sidewalls of the polymerized material layer 980 having a non-zero uniform radius of curvature Rc throughout and adjoined to the planar top surface of the polymerized material layer 980.

An adhesive layer 978 can contact a top surface of the passivation dielectric layer 970, and can contact a bottom surface of the polymerized material layer 980. In one embodiment, the passivation dielectric layer 970 covers peripheral portions of the bonding pads 948 underneath the openings through the polymerized material layer 980, and is physically exposed underneath each opening through the polymerized material layer 980. In one embodiment, the polymerized material layer 980 comprises a polymerized polyimide layer (e.g., a non-photosensitive polyimide layer) or a polymerized siloxane resin.

Referring to FIGS. 3A-3F and 4A-4E and according to various embodiments of the present disclosure, a method of forming a semiconductor structure includes providing a semiconductor wafer 300 including a plurality of semiconductor dies 900, providing a polymerized material layer 980, attaching the polymerized material layer 980 to the semiconductor wafer 300 such that the polymerized material 980 layer is polymerized prior to the step of attaching the polymerized material layer to the semiconductor wafer, applying and patterning an etch mask layer (982 or 887) over the polymerized material layer, such that openings are formed through the etch mask layer, etching portions of the polymerized material layer that are proximal to the openings through the etch mask layer by applying an etchant into the openings through the etch mask layer in an etch process, and removing the etch mask layer (982, 887) selective to the polymerized material layer 980.

In one embodiment, the etch process comprises an isotropic etch process, and remaining portions of the polymerized material layer 980 after the etch process include concave sidewalls having a non-zero, uniform radius of curvature (Rc) throughout. The radius of curvature may be equal to or greater than a thickness of the polymerized material layer 980. Alternatively, the polymerized material layer 980 can be anisotropically etched.

In one embodiment illustrated in FIGS. 3C-3E, the etch mask layer comprises an inorganic dielectric hard mask 982. In another embodiment illustrated in FIGS. 4B-4D, the etch mask layer comprises an organic photosensitive material layer 887. The etch mask layer 887 is formed by providing a dry film comprising a stack of a cover layer 886 and the photosensitive material layer 887, attaching a combination of the photosensitive material layer and the cover layer to the polymerized material layer 980 such that the photosensitive material layer contacts the polymerized material layer, exposing the photosensitive material layer 887 through the cover layer 886, detaching the cover layer 886 from the photosensitive material layer 887, and developing the exposed photosensitive material layer 887 to form the etch mask layer.

FIGS. 5A-5E are sequential schematic vertical cross-sectional views of a portion of a transfer substrate 600 during formation of a patterned polymerized material layer 980 thereupon according to a third embodiment of the present disclosure.

Referring to FIG. 5A, a transfer substrate 600 is provided, which may be an insulating substrate, a conductive substrate, or a semiconductor substrate. In one embodiment, the transfer substrate 600 may be a transparent substrate, such as a plastic substrate, a quartz substrate or a sapphire substrate. In another embodiment, the transfer substrate 600 may be a semiconductor substrate, such as a silicon wafer. A sacrificial adhesive layer 678 can be formed on the top surface of the transfer substrate. In case the transfer substrate 600 includes a transparent substrate, the sacrificial adhesive layer 678 may include an ultraviolet-decomposable adhesive material. Alternatively, the sacrificial adhesive layer 678 may include a thermally decomposable adhesive material that decomposes in a temperature range from 200 degrees Celsius to 400 degrees Celsius, such as from 300 degrees Celsius to 400 degrees Celsius. Alternatively, the sacrificial adhesive layer 678 may be a relatively weak adhesive layer.

A polymerized material layer 980 can be formed on the top surface of the sacrificial adhesive layer 678. The polymerized material layer 980 can be the same as the polymerized material layer 980 of the first embodiment described above.

Referring to FIG. 5B, an etch mask layer 982 can be deposited over the top surface of the polymerized material layer 980. In one embodiment, the etch mask layer 982 includes a hard mask material, e.g., an inorganic dielectric material, as in the first embodiment. In one embodiment, the etch mask layer 982 can be deposited at a temperature not higher than 400 degrees Celsius, and may be deposited at a temperature in a range from 200 degrees Celsius to 400 degrees Celsius by plasma enhanced chemical vapor deposition (PECVD) or spin on deposition (e.g., if the etch mask layer 982 is a spin-on glass). In one embodiment, the etch mask layer 982 may include silicon oxide (e.g., silicon dioxide formed by PECVD or spin-on glass) or silicon nitride formed by PECVD.

Referring to FIG. 5C, a photoresist material layer 987 can be applied over the etch mask layer 982, for example, by spin coating. The photoresist material layer 987 may be the same as in the first embodiment.

The photoresist material layer 987 can be lithographically patterned by lithographic exposure and development. The pattern in the developed photoresist material layer 987 includes a pattern of openings, which is a mirror image of the pattern of the openings through the passivation dielectric layer 970 in a semiconductor die 900 (such as a semiconductor die 900 in FIG. 2 and/or the semiconductor die 900 illustrated in FIG. 3A) to which the polymerized material layer 980 is to be subsequently transferred. Further, a continuous mesh-shaped opening can be formed through the developed photoresist material layer 987 in a pattern that is a mirror image pattern of the entirety of the kerf regions 320 in the semiconductor wafer 300 of FIG. 2. The continuous mesh-shaped opening includes a plurality of intersecting channels.

An etch process can be performed to transfer the pattern in the developed photoresist material layer 987 through the etch mask layer 982. The etch process may be an isotropic etch process (such as a wet etch process) or an anisotropic etch process (such as a reactive ion etch process). Generally, the etch mask layer 982 can be patterned by transferring the pattern in the photoresist material layer 987 into the etch mask layer 982.

Referring to FIG. 5D, portions of the polymerized material layer 980 that are proximal to the openings through the etch mask layer 982 can be etched, such as isotropically etched, by applying an etchant, such as an isotropic etchant into the openings through the etch mask layer 982 in an isotropic etch process, similar to the etching process described in the first embodiment with respect to FIG. 3E. The isotropic etch process etches proximal portions of the polymerized material layer 980 from underneath each opening in the etch mask layer 982. Remaining portions of the polymerized material layer 980 after the isotropic etch process include concave sidewalls having a uniform radius of curvature Rc throughout. The duration of the isotropic etch process can be selected such that the etch distance into the polymerized material layer 980 is greater than the thickness of the polymerized material layer 980. In this case, the uniform radius of curvature Rc of the concave sidewalls of the remaining portions of the polymerized material layer 980 can be greater than the thickness of the polymerized material layer 980. Alternatively, the polymerized material layer 980 can be anisotropically etched.

Generally, discrete openings are formed in the polymerized material layer 980 upon etching the portions of the polymerized material layer 980 that are proximal to the openings through the etch mask layer 982. Further, a mesh-shaped opening is formed in the polymerized material layer 980 during etching of the portions of the polymerized material layer 980 that are proximal to the openings through the etch mask layer 982. The mesh-shaped opening in the polymerized material layer 980 is formed underneath the mesh-shaped opening through the etch mask layer 982, and may have a mirror image pattern of the pattern of the kerf regions 320 of the semiconductor wafer 300.

Referring to FIG. 5E, the etch mask layer 982 can be removed selective to the polymerized material layer 980. A wet etch process employing an inorganic etchant may be employed. For example, if the etch mask layer 982 include silicon oxide, the wet etch process can employ hydrofluoric acid. The patterned polymerized material layer 980 is formed on the transfer substrate 600 such that the patterned polymerized material layer 980 includes openings that are arranged in a mirror image pattern of a pattern of the bonding pads 948 on a semiconductor wafer 300 to which the patterned polymerized material layer 980 is subsequently transferred.

FIGS. 5F-5H are sequential schematic vertical cross-sectional views of a portion of a semiconductor die 900 and an adjacent kerf region 320 during transfer of the patterned polymerized material layer 980 thereto according to the third embodiment of the present disclosure.

Referring to FIG. 5F, a region of a semiconductor die 900 and a kerf region 320 are illustrated. The semiconductor die 900 and the kerf region 320 may be the same as the semiconductor die 900 and the kerf region 320 of FIG. 3A.

An adhesive layer 978 can be formed over the semiconductor wafer 300 as a continuous material layer. Thus, the adhesive layer 978 can be formed on the top surface of the passivation dielectric layer 970 and on each physically exposed surface of the bonding pads 948. The adhesive layer 978 can include any adhesive material that can be applied with a uniform thickness. For example, the adhesive layer 978 can include a pressure-sensitive adhesive material or thermoplastic adhesive material. If the sacrificial adhesive layer 678 includes a relatively weak adhesive, then the adhesive layer 978 includes a relatively strong adhesive which is stronger than the sacrificial adhesive layer 678. If the sacrificial adhesive layer 678 includes a thermally decomposable adhesive material, the adhesive layer 978 includes an adhesive material having a higher thermal decomposition temperature. If the sacrificial adhesive layer 678 includes an ultraviolet decomposable adhesive material, the adhesive layer 978 may include an adhesive material that is not decomposed by ultraviolet radiation and/or the polymerized material layer 980 may include a material that blocks ultraviolet irradiation.

Referring to FIG. 5G, the patterned polymerized material layer 980 on the transfer substrate 600 of FIG. 5E can be transferred to the semiconductor wafer 300 by attaching the patterned polymerized material layer 980 to the semiconductor wafer 300. The patterned polymerized material layer 980 can be disposed over the semiconductor wafer 300 including an array of semiconductor dies 900 and kerf regions 320 such that each discrete opening in the patterned polymerized material layer 980 overlies a respective bonding pads 948, and the mesh-shaped opening in the patterned polymerized material layer 980 overlies the kerf regions 320 of the semiconductor wafer 300. After alignment, the patterned polymerized material layer 980 can be attached to the adhesive layer 978 by pressing the backside of the substrate 600 against the semiconductor wafer 300. If the transfer substrate 600 is transparent, then the openings in the polymerized material layer 980 can be optically aligned to the bonding pads 948 by viewing radiation transmitted through the transfer substrate.

Referring to FIG. 5H, the patterned polymerized material layer 980 can be detached from the transfer substrate 600 while the patterned polymerized material layer 980 is attached to the semiconductor wafer 300 through the adhesive layer 978. In one embodiment, the relatively weak sacrificial adhesive layer 678 and the transfer substrate 600 can be peeled off from the patterned polymerized material layer 980 is attached to the semiconductor wafer 300 through the adhesive layer 978. In another embodiment, the sacrificial adhesive layer 678 can be deactivated by ultraviolet radiation provided through the transfer substrate 600 in case the transfer substrate 600 is transparent and the sacrificial adhesive layer 678 includes an ultraviolet-decomposable adhesive material. In another embodiment, the sacrificial adhesive layer 678 can be deactivated by a thermal anneal in case the sacrificial adhesive layer 678 includes a thermally decomposable adhesive material. In embodiments in which the bonding pads 948 are covered with the adhesive layer 978 at this processing step, the physically exposed portions of the adhesive layer 978 can be removed by performing a wet etch process that removes the physically exposed portions of the adhesive layer 978 selective to the material of the patterned polymerized material layer 980. The patterned polymerized material layer 980 is incorporated as a component of the semiconductor wafer 300, and the transfer substrate 600 can be detached, cleaned, and reused for a next transfer process.

The bonding pads 948 are physically exposed in the openings through the patterned polymerized material layer 980. The patterned polymerized material layer 980 includes a mesh-shaped opening overlying the kerf regions 320 between neighboring pairs of semiconductor dies 900 within the semiconductor wafer 300. Thus, the kerf regions 320 are not covered by the patterned polymerized material layer 980 upon transfer of the patterned polymerized material layer 980 to the semiconductor wafer 300.

The semiconductor dies 900 within the semiconductor wafer 300 includes a polymerized material layer 980 overlying the passivation dielectric layer 970, having a planar top surface, and including openings therethrough. A horizontal cross-sectional area of each opening through the polymerized material layer 980 decreases with a vertical distance from the semiconductor substrate 908, which portion of the semiconductor wafer 300 which supports the respective semiconductor die 900. Sidewalls of the openings through the polymerized material layer have a respective concave vertical cross-sectional profile. In one embodiment, the sidewalls of the openings through the polymerized material layer 980 have a non-zero uniform radius of curvature Rc throughout.

In one embodiment, the polymerized material layer 980 has a planar top surface, and the sidewalls of the openings through the polymerized material layer 980 have a respective top edge that coincides with a respective edge of the planar top surface of the polymerized material layer 980. In one embodiment, each of the bonding pads 948 is physically exposed underneath a respective one of the openings through the polymerized material layer 980.

In one embodiment, a passivation dielectric layer 970 covers a topmost surface of the dielectric material layers 930 and covers peripheral portions of each of the bonding pads 948. In one embodiment, an adhesive layer 978 contacts a top surface of the passivation dielectric layer 970, and contacts a planar bottom surface of the polymerized material layer 980. In one embodiment, the passivation dielectric layer 970 is physically exposed underneath each opening through the polymerized material layer 980. In one embodiment, the polymerized material layer 980 comprises a polymerized polyimide layer or a polymerized silicone resin layer.

FIGS. 6A-6D are sequential schematic vertical cross-sectional views of a portion of a transfer substrate during formation of a patterned polymerized material layer thereupon according to a fourth embodiment of the present disclosure.

Figure 6A:
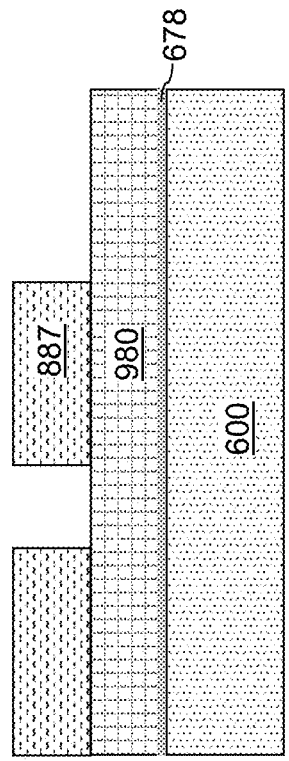
FIGS. 6A-6D are sequential schematic vertical cross-sectional views of a portion of a transfer substrate during formation of a patterned polymerized material layer thereupon according to a fourth embodiment of the present disclosure.

Referring to FIG. 6A, the structure of FIG. 6A can be derived from the structure of FIG. 5A by preparing a dry film that includes a stack of a cover layer 886, a photosensitive material layer 887, and optionally a base layer (not shown). The dry film may be the same as the dry film employed at the processing steps of FIG. 4B. The photosensitive material layer 887 and the cover layer 886 are peeled off from the base layer. The combination of the photosensitive material layer 887 and the cover layer 886 can be attached to the polymerized material layer 980 after removing the base layer such that the photosensitive material layer 887 contacts the polymerized material layer 980. In one embodiment, pressure may be applied to the photosensitive material layer 887 through the cover layer 886 to promote adhesion of the photosensitive material layer 887 to the polymerized material layer 980 located on the transfer substrate 600.

Figure 6B:
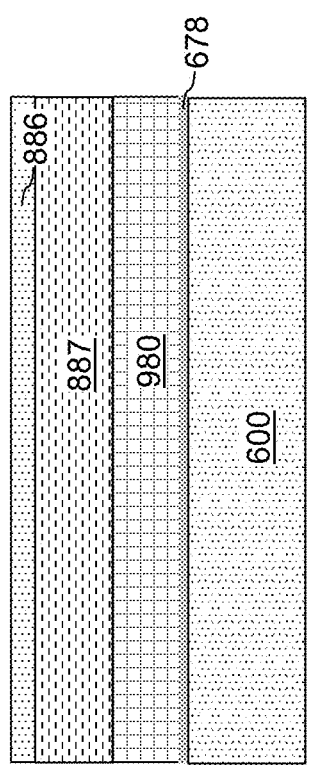

Referring to FIG. 6B, the photosensitive material layer 887 can lithographically exposure through the cover layer 886 (which is transparent to UV radiation) in a desired pattern. Subsequently the cover layer 886 can be detached from the photosensitive material layer 887, for example, by peeling off. After detaching the cover layer 886, the photosensitive material layer 887 is developed to be lithographically patterned into a pattern.

The pattern in the developed photosensitive material layer 887 includes a pattern of openings, which is a mirror image of the pattern of the openings through the passivation dielectric layer 970 in a semiconductor die 900 (such as a semiconductor die 900 in FIG. 2 and/or the semiconductor die 900 illustrated in FIG. 3A) to which the polymerized material layer 980 is to be subsequently transferred. Further, a continuous mesh-shaped opening can be formed through the developed photosensitive material layer 887 in a pattern that is a mirror image pattern of the entirety of the kerf regions 320 in the semiconductor wafer 300 of FIG. 2. The continuous mesh-shaped opening includes a plurality of intersecting channels. The patterned photosensitive material layer 887 can function as an etch mask layer.

Figure 6C:
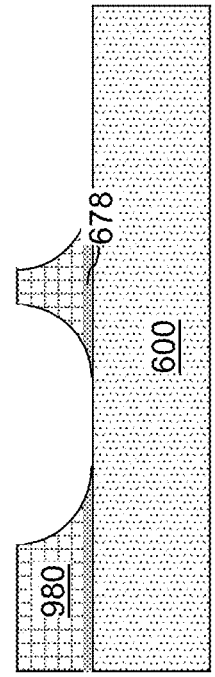

Referring to FIG. 6C, portions of the polymerized material layer 980 that are proximal to the openings through the patterned photosensitive material layer 887 can be etched, such as isotropically etched, by applying an etchant, such as an isotropic etchant, into the openings through the patterned photosensitive material layer 887 in an etch process, such as an isotropic etch process, as described above with respect to FIG. 4D. The isotropic etch process etches proximal portions of the polymerized material layer 980 from underneath each opening in the etch mask layer 982. Remaining portions of the polymerized material layer 980 after the isotropic etch process include concave sidewalls having a uniform radius of curvature Rc throughout. The duration of the isotropic etch process can be selected such that the etch distance into the polymerized material layer 980 is greater than the thickness of the polymerized material layer 980. In this case, the non-zero uniform radius of curvature Rc of the concave sidewalls of the remaining portions of the polymerized material layer 980 can be greater than the thickness of the polymerized material layer 980. An overhang portion of the patterned photosensitive material layer 887 overlies each undercut region adjacent to the concave sidewalls of the polymerized material layer 980. Alternatively, the polymerized material layer 980 can be anisotropically etched.

Figure 6D:
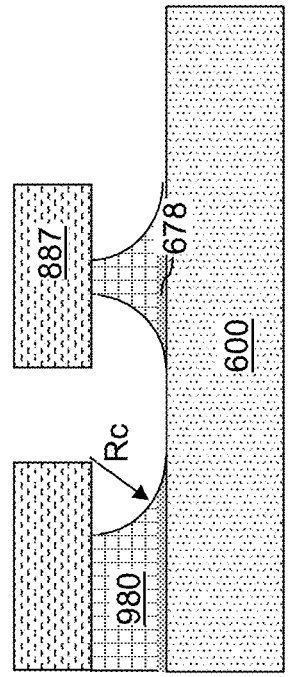

Referring to FIG. 6D, the patterned photosensitive material layer 987 overlying the etch mask layer 982 can be collaterally etched during the etch process that recesses the material of the polymerized material layer 980. Alternatively, the etch process may have a high selectivity relative to the material of the patterned photosensitive material layer 887, and a significant portion of the patterned photosensitive material layer 887 may remain after the etch process. In this case, the patterned photosensitive material layer 887 may be removed by performing a subsequent removal process, which may include peeling off the patterned photosensitive material layer 887 from the remaining portions of the polymerized material layer 980.

Generally, discrete openings are formed in the polymerized material layer 980 upon etching the portions of the polymerized material layer 980 that are proximal to the openings through the etch mask layer 982. Further, a mesh-shaped opening is formed in the polymerized material layer 980 during etching of the portions of the polymerized material layer 980 that are proximal to the openings through the etch mask layer 982. The mesh-shaped opening in the polymerized material layer 980 is formed underneath the mesh-shaped opening through the organic etch mask layer 887, and may have a mirror image pattern of the pattern of the kerf regions 320 of the semiconductor wafer 300.

FIGS. 6E-6G are sequential schematic vertical cross-sectional views of a portion of a semiconductor die 900 and an adjacent kerf region 320 during transfer of the patterned polymerized material layer 980 thereto according to the fourth embodiment of the present disclosure.

Referring to FIG. 6E, a region of a semiconductor die 900 and a kerf region 320 are illustrated. The semiconductor die 900 and the kerf region 320 may be the same as the semiconductor die 900 and the kerf region 320 of FIG. 3A. An adhesive layer 978 can be formed over the semiconductor wafer 300 as a continuous material layer. The processing steps of FIG. 5F may be performed to form the adhesive layer 978. The structure after the processing steps of FIG. 6E may be the same as the structure after the processing steps of FIG. 5F.

Referring to FIG. 6F, the patterned polymerized material layer 980 on the transfer substrate 600 of FIG. 6D can be transferred to the semiconductor wafer 300 by attaching the patterned polymerized material layer 980 to the semiconductor wafer 300. The processing steps of FIG. 5G can be employed at this processing step. The patterned polymerized material layer 980 can be disposed over the semiconductor wafer 300 including an array of semiconductor dies 900 and kerf regions 320 such that each discrete opening in the patterned polymerized material layer 980 overlies a respective bonding pads 948, and the mesh-shaped opening in the patterned polymerized material layer 980 overlies the kerf regions 320 of the semiconductor wafer 300. After alignment, the patterned polymerized material layer 980 can be attached to the adhesive layer 978 by pressing the backside of the substrate 600 against the semiconductor wafer 300.

Referring to FIG. 6G, the patterned polymerized material layer 980 can be detached from the transfer substrate 600 while the patterned polymerized material layer 980 is attached to the semiconductor wafer 300 through the adhesive layer 978. The processing steps of FIG. 5F may be performed at this processing step. The patterned polymerized material layer 980 is incorporated as a component of the semiconductor wafer 300, and the transfer substrate 600 can be detached, cleaned, and reused for a next transfer process.

The bonding pads 948 are physically exposed in the openings through the patterned polymerized material layer 980. The patterned polymerized material layer 980 includes a mesh-shaped opening overlying the kerf regions 320 between neighboring pairs of semiconductor dies 900 within the semiconductor wafer 300. Thus, the kerf regions 320 are not covered by the patterned polymerized material layer 980 upon transfer of the patterned polymerized material layer 980 to the semiconductor wafer 300.

The semiconductor dies 900 of the semiconductor wafer 300 include a polymerized material layer 980 overlying the passivation dielectric layer 970, having a planar top surface, and including openings therethrough. A horizontal cross-sectional area of each opening through the polymerized material layer 980 decreases with a vertical distance from the semiconductor substrate 908, which is portion of the semiconductor wafer 300 supporting one semiconductor die 900. Sidewalls of the openings through the polymerized material layer have a respective concave vertical cross-sectional profile. In one embodiment, the sidewalls of the openings through the polymerized material layer 980 have a non-zero uniform radius of curvature Rc throughout.

In one embodiment, the polymerized material layer 980 has a planar top surface, and the sidewalls of the openings through the polymerized material layer 980 have a respective top edge that coincides with a respective edge of the planar top surface of the polymerized material layer 980. In one embodiment, each of the bonding pads 948 is physically exposed underneath a respective one of the openings through the polymerized material layer 980.

In one embodiment, a passivation dielectric layer 970 covers a topmost surface of the dielectric material layers 930 and covers peripheral portions of each of the bonding pads 948. In one embodiment, an adhesive layer 978 contacts a top surface of the passivation dielectric layer 970, and contacts a planar bottom surface of the polymerized material layer 980. In one embodiment, the passivation dielectric layer 970 is physically exposed underneath each opening through the polymerized material layer 980. In one embodiment, the polymerized material layer 980 comprises a polymerized polyimide layer or a polymerized silicone resin.

FIGS. 7A and 7B are sequential schematic vertical cross-sectional views of a portion of a transfer substrate 600 during formation of a patterned polymerized material layer thereupon according to a fifth embodiment of the present disclosure.

Referring to FIG. 7A, a polymerized material layer 980 can be formed on a top surface of a transfer substrate 600. For example, the structure of FIG. 5A can be employed. Alternatively, the transfer substrate 600 may comprise a flexible polymer sheet, such as a transparent flexible polymer sheet. Generally, a blanket polymerized material layer (i.e., an unpatterned polymerized material layer) can be formed over the transfer substrate 600. Subsequently, portions of the blanket polymerized material layer can 980 can be cut by at least one patterning blade 770 which is pressed into the blanket polymerized material layer 980. The at least one patterning blade 770 may include a single blade attached to a stamp 772, or may include a plurality of blades attached to the stamp 772. The blades 770 are pressed into the polymerized material layer 980 by pressing the stamp 772 against the transfer substrate 600 to form cuts 981 in the polymerized material layer 980.

Portions of the polymerized material layer 980 located between the cuts 981 are removed by lifting off material portions of the blanket polymerized material layer 980 using vacuum suctioning. The vacuum suctioning may be performed by a vacuum jig 774 incorporated into the stamp 772.

Referring to FIG. 7B, the transfer substrate 600, the sacrificial adhesive layer 678, and the patterned polymerized material layer 980 are illustrated after completion of patterning the blanket polymerized material layer 980. Discrete openings in the patterned polymerized material layer 980 can be arranged in a pattern that is a mirror image pattern of the pattern of bonding pads 948 on a semiconductor wafer 300 to which the patterned polymerized material layer 980 is to be transferred. Further, a mesh-shaped opening is formed in the polymerized material layer 980 such that the pattern of the mesh-shaped opening is a mirror image pattern of the pattern of the kerf regions 320 of the semiconductor wafer 300 to which the patterned polymerized material layer 980 is to be subsequently transferred.

Figure 7E:
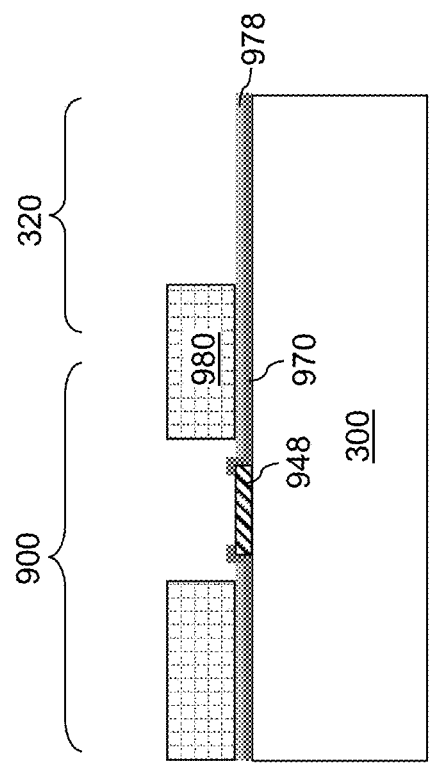

FIGS. 7C-7E are sequential schematic vertical cross-sectional views of a portion of a semiconductor die 900 and an adjacent kerf region 320 during transfer of the patterned polymerized material layer thereto according to the fifth embodiment of the present disclosure.

Referring to FIG. 7C, a region of a semiconductor die 900 and a kerf region 320 are illustrated. The semiconductor die 900 and the kerf region 320 may be the same as the semiconductor die 900 and the kerf region 320 of FIG. 3A. An adhesive layer 978 can be formed over the semiconductor wafer 300 as a continuous material layer. The processing steps of FIG. 5F may be performed to form the adhesive layer 978. The structure after the processing steps of FIG. 7C may be the same as the structure after the processing steps of FIG. 5F.

Referring to FIG. 7D, the patterned polymerized material layer 980 on the transfer substrate 600 of FIG. 7B can be transferred to the semiconductor wafer 300 by attaching the patterned polymerized material layer 980 to the semiconductor wafer 300. The processing steps of FIG. 5G can be employed at this processing step. Alternatively, if the transfer substrate 600 is a flexible polymer film, then the transfer substrate 600 containing the patterned polymerized material layer 980 may be rolled up after the step shown in FIG. 7B, and then unrolled over the semiconductor wafer 300 as shown in FIG. 7D. The patterned polymerized material layer 980 can be disposed over the semiconductor wafer 300 including an array of semiconductor dies 900 and kerf regions 320 such that each discrete opening in the patterned polymerized material layer 980 overlies a respective bonding pads 948, and the mesh-shaped opening in the patterned polymerized material layer 980 overlies the kerf regions 320 of the semiconductor wafer 300. After alignment, the patterned polymerized material layer 980 can be attached to the adhesive layer 978 by pressing the backside of the substrate 600 against the semiconductor wafer 300.

Referring to FIG. 7E, the patterned polymerized material layer 980 can be detached from the transfer substrate 600 while the patterned polymerized material layer 980 is attached to the semiconductor wafer 300 through the adhesive layer 978. The processing steps of FIG. 5F may be performed at this processing step. The patterned polymerized material layer 980 is incorporated as a component of the semiconductor wafer 300, and the transfer substrate 600 can be detached, cleaned, and reused for a next transfer process.

The bonding pads 948 are physically exposed in the openings through the patterned polymerized material layer 980. The patterned polymerized material layer 980 includes a mesh-shaped opening overlying the kerf regions 320 between neighboring pairs of semiconductor dies 900 within the semiconductor wafer 300. Thus, the kerf regions 320 are not covered by the patterned polymerized material layer 980 upon transfer of the patterned polymerized material layer 980 to the semiconductor wafer 300. The semiconductor dies 900 within the semiconductor wafer 300 includes a polymerized material layer 980 overlying the passivation dielectric layer 970, having a planar top surface, and including openings therethrough.

The semiconductor wafer 300 may then be diced along the kerf regions 320 to form a plurality of separated (i.e., singulated) semiconductor die 900, each containing a portion of the patterned polymerized material layer 980 with openings exposing the bonding pads 948. A portion of patterned polymerized material layer 980 on each die 900 acts as a top side protective coating layer (i.e., buffer film) for each die 900.

The various embodiments of the present disclosure can be employed to reduce stress on the semiconductor wafer 300 containing semiconductor dies 900 at the processing steps of forming a protective coating layer by using the polymerized material layer 980. The polymerized material layer 980 is applied to the semiconductor dies 900 located on the semiconductor wafer 300 in a polymerized form. Thus, polymerization process or accompanying stress generation does not occur on any semiconductor die 900 or on the semiconductor wafer 300 according to various embodiments of the present disclosure. Thus, warpage of the semiconductor wafer 300 containing the dies 900 can be reduced prior to dicing and after dicing.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A method of forming a semiconductor structure, comprising:
    providing a semiconductor wafer including a plurality of semiconductor dies and bonding pads located within the plurality of semiconductor dies;
    providing a transfer substrate;
    forming a polymerized material layer on the transfer substrate;
    applying and patterning an etch mask layer over the polymerized material layer located on the transfer substrate, wherein openings are formed through the etch mask layer;
    etching portions of the polymerized material layer that are proximal to the openings through the etch mask layer by applying an etchant into the openings through the etch mask layer in an etch process to form discrete openings in the polymerized material layer located on the transfer substrate;
    removing the etch mask layer selective to the polymerized material layer; and
    attaching the polymerized material layer to the semiconductor wafer, wherein:
        the polymerized material layer is polymerized on the transfer substrate prior to the step of attaching the polymerized material layer to the semiconductor wafer; and
        top surfaces of the bonding pads are physically exposed in the discrete openings in the polymerized material layer after attaching the polymerized material layer to the semiconductor wafer.

2. The method of claim 1, wherein the semiconductor wafer comprises:
    a passivation dielectric layer covering peripheral portions of the bonding pads and covering dielectric material layers of the plurality of semiconductor dies that embed metal interconnect structures.

3. The method of claim 1, wherein:
    a mesh-shaped opening is also formed in the polymerized material layer during etching of the portions of the polymerized material layer that are proximal to the openings through the etch mask layer; and
    the mesh-shaped opening extends through areas between each laterally-neighboring pair of semiconductor dies, and laterally surrounds and encloses each area of the plurality of semiconductor dies.

4. The method of claim 1, wherein:
    the etch process comprises an isotropic etch process; and
    remaining portions of the polymerized material layer after the etch process include concave sidewalls having a uniform radius of curvature throughout.

5. The method of claim 4, wherein the uniform radius of curvature is greater than a thickness of the polymerized material layer.

6. The method of claim 1, further comprising:
    forming an adhesive layer over the semiconductor wafer, wherein the polymerized material layer is attached to the semiconductor wafer by the adhesive layer.

7. The method of claim 1, further comprising:
    applying and patterning a photoresist material layer over the etch mask layer to form openings through the photoresist material layer; and
    patterning the etch mask layer by transferring a pattern in the photoresist material layer into the etch mask layer.

8. The method of claim 7, wherein the etch mask layer comprises an inorganic dielectric hard mask.

9. The method of claim 1, wherein the etch mask layer comprises an organic photosensitive material layer.

10. The method of claim 9, further comprising:
    providing a dry film comprising a stack of a cover layer and the organic photosensitive material layer;
    attaching a combination of the organic photosensitive material layer and the cover layer to the polymerized material layer such that the organic photosensitive material layer contacts the polymerized material layer;
    exposing the organic photosensitive material layer through the cover layer;
    detaching the cover layer from the organic photosensitive material layer; and
    developing the exposed organic photosensitive material layer to form the etch mask layer.

11. The method of claim 1, wherein the polymerized material layer is formed by depositing precursor solution over the transfer substrate to form a precursor film, followed by curing the precursor film to polymerize the precursor film and form the polymerized material layer prior to attaching the polymerized material layer to the semiconductor wafer.

12. The method of claim 1, wherein the polymerized material layer comprises a polymerized polyimide layer.

13. The method of claim 1, wherein the polymerized material layer comprises a polymerized silicone resin layer.

14. The method of claim 1, further comprising detaching the polymerized material layer from the transfer substrate after attaching the polymerized material layer to the semiconductor wafer.

15. The method of claim 1, wherein the polymerized material layer is a dry, solid film which lacks a solvent during attaching the polymerized material layer to the semiconductor wafer.

* * * * *